(12) United States Patent
Seo et al.

(10) Patent No.: US 7,515,468 B2
(45) Date of Patent: Apr. 7, 2009

(54) NONVOLATILE MEMORY DEVICE

(75) Inventors: Bo-Young Seo, Anyang-si (KR);
Hee-Seog Jeon, Suwon-si (KR);
Jeong-Uk Han, Suwon-si (KR);
Sung-Taeg Kang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 337 days.

(21) Appl. No.: 11/600,427

(22) Filed: Nov. 16, 2006

(65) Prior Publication Data

US 2007/0195595 A1 Aug. 23, 2007

(30) Foreign Application Priority Data

Nov. 17, 2005 (KR) .................... 10-2005-0110006

(51) Int. Cl.
*G11C 11/34* (2006.01)
(52) U.S. Cl. ................. 365/185.05; 365/63; 365/185.28
(58) Field of Classification Search ............ 365/185.05, 365/63, 185.28
See application file for complete search history.

(56) References Cited

U.S. PATENT DOCUMENTS

| 5,412,600 | A | 5/1995 | Nakajima |
| 6,184,552 | B1 | 2/2001 | Kalnitsky et al. |
| 6,246,088 | B1 * | 6/2001 | Chang ........................ 257/314 |
| 2004/0057287 | A1 | 3/2004 | Cernea et al. |
| 2005/0029577 | A1 | 2/2005 | Nishizaka et al. |
| 2006/0114719 | A1 * | 6/2006 | Lee ........................ 365/185.17 |

FOREIGN PATENT DOCUMENTS

| JP | 05-291539 | 11/1993 |
| JP | 2005-051227 | 2/2005 |
| WO | 2005/048269 A2 | 5/2005 |

* cited by examiner

*Primary Examiner*—Tuan T. Nguyen
(74) *Attorney, Agent, or Firm*—Mills & Onello, LLP

(57) ABSTRACT

A nonvolatile memory device includes a memory cell unit including a pair of memory transistors and one select transistor. The select transistor is disposed between the pair of memory transistors formed in an active region in a semiconductor substrate. Two bit lines are provided, one bit line being connected to a corresponding one of the pair of memory transistors, and the other bit line being connected to a corresponding other of the pair of memory transistors.

19 Claims, 7 Drawing Sheets

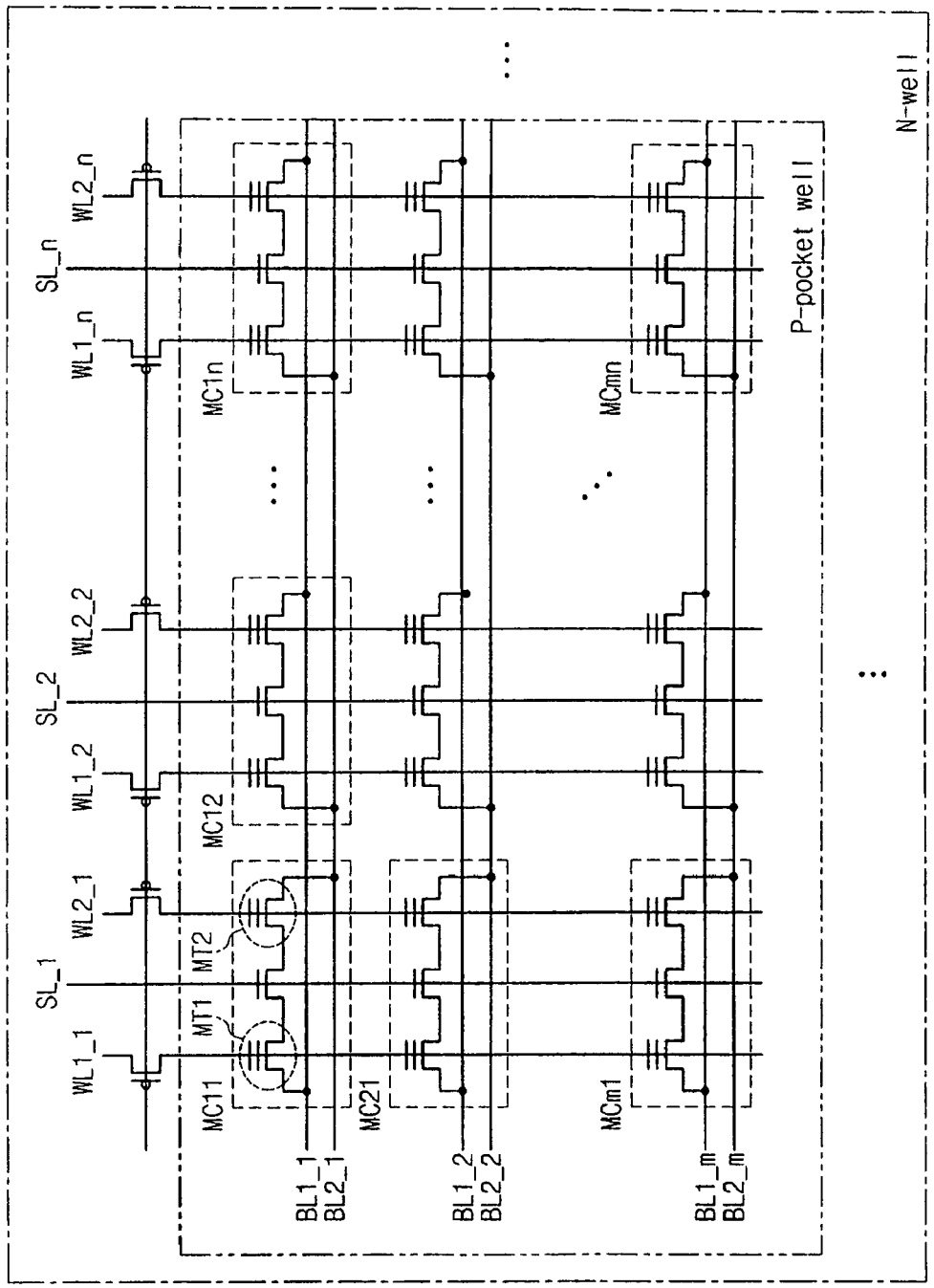

NONVOLATILE MEMORY DEVICE

RELATED APPLICATIONS

This application claims priority under 35 U.S.C. 119 to Korean Patent Application No. 10-2005-110006, filed on Nov. 17, 2006, the content of which is incorporated herein by reference, in its entirety.

BACKGROUND OF THE INVENTION

1. Field of the Invention

The present invention relates to a semiconductor device, and more particularly, to a nonvolatile memory device.

2. Description of the Related Art

Nonvolatile memory devices retain data even when an external power source is removed.

Nonvolatile memory devices can generally be categorized as MASK ROM, an EPROM, and an EEPROM.

FIGS. 1A, 1B and 1C are a plan view of a general EEPROM, a cross-sectional view taken along line I-I' of FIG. 1A, and an equivalent circuit thereof, respectively. Referring to FIGS. 1A, 1B and 1C, a source region 12s, a drain region 12d, and a floating diffusion region 12f are provided in an active region 12 defined by device isolation layers 13 in a semiconductor substrate 11.

A word line WL is provided across the active region 12, extending in a first direction. A select line SL is spaced apart from the word line WL parallel thereto, and is likewise provided across the active region. A bit line BL is connected to the source region 12s through a bit line contact plug 31, and extends in a second direction transverse to the first direction.

A floating gate electrode 21, an intergate dielectric layer 23, and a control gate electrode 25 are stacked on an active region between the source region 12s and the floating diffusion region 12f, and a gate insulating layer 15 is interposed between the floating gate electrode and the active region. The control gate electrode 25 is connected to the word line WL. The floating diffusion region 12f extends into the active region under the word line WL. A memory transistor MT of the device can include the source region 12s, the floating diffusion region 12f, and a stacked gate electrode including the floating gate electrode 21, the intergate dielectric layer 23 and the control gate electrode 25. A portion of the gate insulating layer 15 may have an opening that exposes the active region, and a tunnel insulating layer (not shown) that is thinner than the gate insulating layer can be provided at the opening.

A select gate electrode 27 is provided on an active region between the floating diffusion region 12f and the drain region 12d, and a select gate insulating layer 17 is interposed between the select gate electrode and the active region. The select gate electrode 27 is connected to the select line SL. A select transistor ST may include the select gate electrode 27, the floating diffusion region 12f, and the drain region 12d. As compared to the memory transistor MT, the select transistor ST may have a general MOS transistor structure. However, the select transistor ST may optionally have a stacked structure, including conductive layers for the floating gate electrode and the control gate electrode. The conductive layers may be electrically connected to each other through an opening.

A memory cell unit of the conventional EEPROM described above includes one select gate and one memory gate, which can store only one-bit of data and does not lend itself toward higher integration.

SUMMARY OF THE INVENTION

Embodiments of the present invention provide a nonvolatile memory device capable of improving the degree of integration.

Embodiments of the present invention provide nonvolatile memory devices. The nonvolatile memory device includes a memory cell unit having a first memory transistor, a second memory transistor, and a select transistor.

In one aspect, the memory cell unit includes a first impurity diffusion region and a second impurity diffusion region in an active region of a semiconductor substrate; first and second memory gates on the active region between the first impurity diffusion region and the second impurity diffusion region, the first and second memory gates each respectively adjacent to the first and second impurity diffusion regions; one select gate on the active region between the first and second memory gates; and first and second floating diffusion regions in the active region between the select gate and a corresponding one of the first and second memory gates. The first memory gate, the second memory gate, and the select gate correspond to a first memory transistor, a second memory transistor, and a select transistor, respectively.

In some embodiments, the first and second memory gates each are provided on the active region with a first insulating layer interposed therebetween, and the select gate is provided on the active region with a second gate insulating layer interposed therebetween. The floating diffusion regions may extend underneath the floating gate electrode. The first and second memory gates constitute the first memory transistor and the second memory transistor, respectively.

In some embodiments, the memory gate includes a floating gate electrode provided on the first gate insulating layer, an intergate dielectric layer, and a control gate electrode.

In other embodiments, a program operation of the memory transistors may be performed by F-N tunneling. The program operation of the first memory transistor may be performed by applying a ground voltage 0V to the semiconductor substrate, the select gate, the second memory gate, and the first impurity diffusion region, floating the second impurity diffusion region, and applying a program voltage Vpgm to the first memory gate.

In further embodiments, a read operation of the first memory transistor is performed by applying a ground voltage 0V to the semiconductor substrate and the second impurity diffusion region, applying a read voltage Vread to the first impurity diffusion region, applying an operation voltage Vcc to the first memory gate and the select gate, and applying a pass voltage Vpass to the second memory gate.

In other embodiments, an erase operation of the first memory transistor is performed by applying a ground voltage 0V to the semiconductor substrate and the second memory gate, floating the first and second impurity diffusion regions, applying an erase voltage Vpgm to the first memory gate, and applying a negative operation voltage -Vcc to the select gate.

In yet other embodiments, the nonvolatile memory device further includes first and second word lines respectively connected to control gate electrodes of the first and second memory gates, and a select line connected to the select gate, and first and second bit lines respectively connected to the first and second impurity diffusion regions.

In further embodiments, the first and second impurity diffusion regions may include a first extending part and a second extending part extending in a direction transverse to a longitudinal direction of extension of the active region. The first extending part and the second extending part extend in opposite directions relative to the longitudinal direction of extension of the active region. The first and second bit lines may be connected to the first and second extending parts, respectively.

In other embodiments, the memory cell units may be arranged on the semiconductor substrate in a matrix configuration in a row-direction and a column-direction. The bit lines are connected in common to the first and second impurity diffusion regions of the adjacent memory cell units.

In further embodiments, the word line and the select line may extend in the column direction, and the bit line may extend in the row direction.

In yet further embodiments, the first impurity diffusion regions of odd memory cell units in the row-direction, and the second impurity diffusion regions of even memory cell units in the row-direction may be connected to the first bit line. The second impurity diffusion regions of the odd memory cell units in the row-direction, and the first impurity diffusion regions of the even memory cell units in the row-direction may be connected to the second bit line.

In other embodiments, the program operation of a first memory transistor of a selected memory cell unit of the memory cell units may comprise applying a program voltage Vpgm to the first word line of the selected memory cell unit. A ground voltage 0V may be applied to the semiconductor substrate, the select line, the second word line, and the first bit line of the selected memory cell unit. The second bit line of the selected memory cell unit may be floated. At the same time, a program-block voltage Vblock may be applied to the first bit lines of unselected memory cell units. The second bit lines of the unselected memory cell units may be floated. A ground voltage 0V may be applied to the word lines and the select lines of the unselected memory cell units.

In yet other embodiments, the read operation of the first memory transistor of the selected memory cell unit of the memory cell units may comprise applying a read voltage Vread to the first bit line of the selected memory cell unit. An operation voltage Vcc may be applied to the first word line and the select line of the selected memory cell unit. A pass voltage Vpass applied to the second word line of the selected memory cell unit. A ground voltage 0V applied to the semiconductor substrate and the second bit line of the selected memory cell unit. At the same time, a ground voltage 0V may be applied to the word lines, the select lines, and the bit lines of unselected memory cell units.

In further embodiments, the erase operation of the first memory transistor of the selected memory cell unit of the memory cell units may comprise applying an erase voltage Vers to the first word line of the selected memory cell unit. A negative operation voltage −Vcc may be applied to the select line of the selected memory cell unit. The first and second bit lines of the selected memory cell unit may be floated. A ground voltage 0V may be applied to the semiconductor substrate and the second word line of the selected memory cell unit. At the same time, the bit lines of the unselected memory cell units may be floated, and a ground voltage 0V may be applied to the word lines and the select lines of unselected memory cell units.

In another aspect, a nonvolatile memory device includes a plurality of memory cell units. The memory cell unit of the device comprises first and second memory transistors provided in an active region in a semiconductor substrate, one select transistor in the acive region disposed between the first and second memory transistors, and first and second bit lines connected to the first and second memory transistors, respectively. The first memory transistor, the select transistor and the second memory transistor may be connected in series between the first and second bit lines.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings:

FIG. 4 is an equivalent circuit of the memory cell array illustrated in FIG. 3.

DETAILED DESCRIPTION OF EMBODIMENTS OF THE INVENTION

Figure 1A:
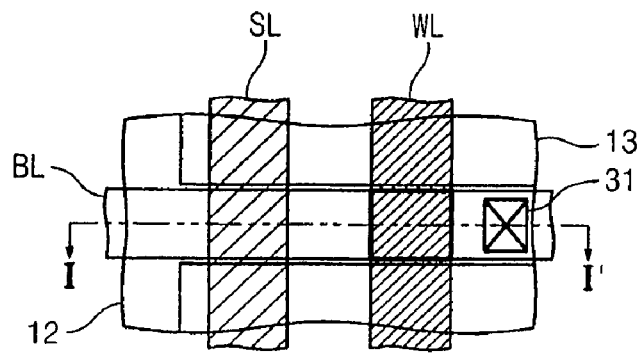
FIGS. 1A, 1B and 1C are a plan view of a conventional EEPROM, a cross-sectional view taken along line I-I' of FIG. 1A, and an equivalent circuit thereof, respectively.
Figure 1B:
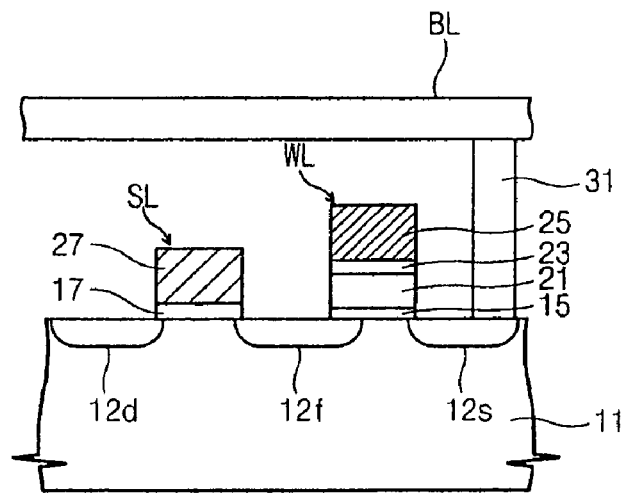
Figure 1C:
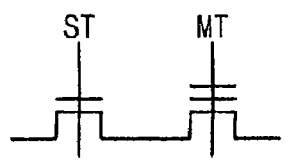

Reference will now be made in detail to embodiments of the present invention, examples of which are illustrated in the accompanying drawings. However, the present invention is not limited to the embodiments illustrated herein after, and the embodiments herein are rather introduced to provide ready and complete understanding of the scope and spirit of the present invention. In the drawings, the thicknesses of layers and regions are exaggerated for clarity. Also, like reference numerals in the drawings denote like elements, and thus their overlapping description will be omitted for conciseness. It will be understood that when a layer is referred to as being "on" another layer or substrate, it can be directly on the other layer or substrate, or intervening layers may also be present.

It will be also understood that, although the terms first, second, third, and the like may be used herein to describe various components, materials, and the like, these components and materials should not be limited by these terms. These terms are only used to distinguish one component and material from another component and material. Thus, a first component and material mentioned in one embodiment could be termed a second component and material in another embodiment without departing from the teachings of the present invention. Each embodiment described and illustrated herein includes its complementary embodiment as well.

The structure of a unit cell of a nonvolatile memory device according to embodiments of the present invention will now be described in connection with FIGS. 2-4.

Figure 2A:
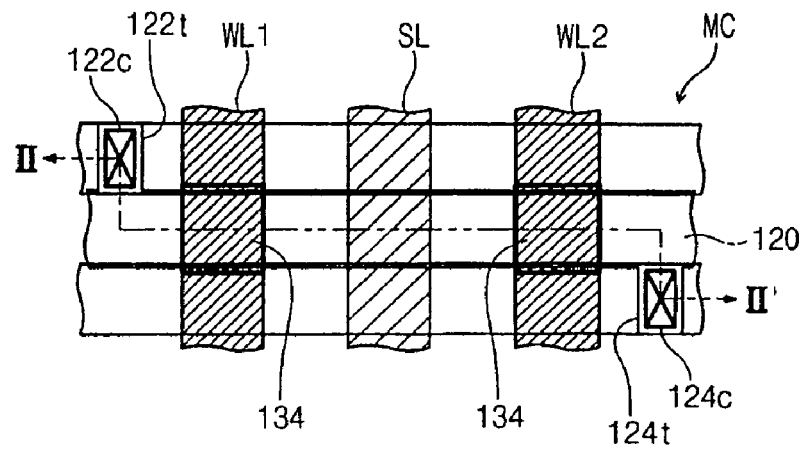
FIGS. 2A, 2B and 2C are a plan view of a nonvolatile memory device according to an embodiment of the present invention, a cross-sectional view taken along line II-II' of FIG. 2A, and an equivalent circuit thereof, respectively.
Figure 2B:
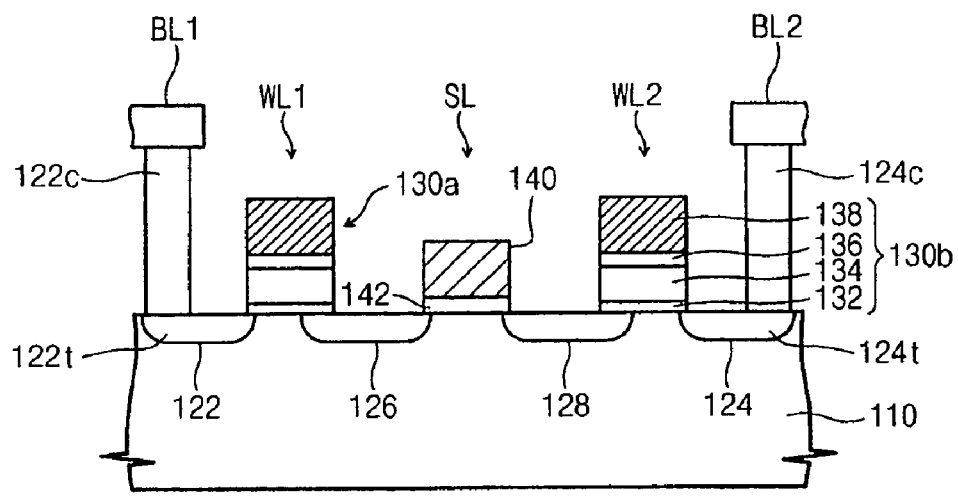
Figure 2C:
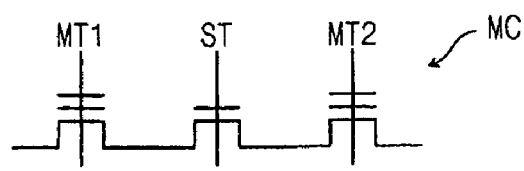

FIGS. 2A, 2B and 2C are a plan view of a nonvolatile memory device according to an embodiment of the present invention, a cross-sectional view taken along line II-II' of FIG. 2A, and an equivalent circuit thereof, respectively.

Referring to FIGS. 2A, 2B and 2C, the nonvolatile memory includes a memory cell unit MC including a first memory transistor MT1 and a second memory transistor MT2 spaced apart from each other. One select transistor ST may be provided between the first memory transistor MT1 and the second memory transistor MT2. Accordingly, the memory cell unit MC may include two memory transistors MT1 and MT2 and one select transistor ST, thereby performing a two-bit data operation.

The memory cell unit MC includes an active region 120 defined by device isolation layers (not shown) on the semiconductor substrate 110. The active region 120 can extend in a first direction. A first impurity diffusion region 122 and a second impurity diffusion region 124 are provided on the active region 120. The first impurity diffusion region 122 and the second impurity diffusion region 124 can have a conductivity that is opposite to that of the semiconductor substrate, and can be used as source/drain regions of the nonvolatile memory device.

The first and second memory gates 130a and 130b are provided on an active region between the first impurity diffusion region 122 and the second impurity diffusion region 124. The first and second memory gates 130a and 130b are adjacent to the first and second impurity diffusion regions 122 and 124, respectively. The memory gates 130a and 130b each include a floating gate electrode 134, an intergate dielectric layer 136, and a control gate electrode 138 on the active region, with a first gate insulating layer 132 interposed between the floating gate electrode and the active region. The floating gate electrodes 134 are provided at intersections of the active region 120 and the control gate electrodes 138. The floating gate electrodes 134 may comprise polycrystalline silicon doped with impurity ions. The control gate electrode 138 may comprise polycrystalline silicon doped with impurity ions, and/or a metal silicide layer.

In one embodiment, the first gate insulating layer 132 can include an opening, in which case, the first gate insulating layer 132 further includes a tunnel insulating layer, thinner than the first gate insulating layer, at the opening. The first gate insulating layer and the tunnel insulating layer can comprise a silicon oxide layer formed by thermal oxidation, and can have thicknesses of about 250~350 Å and 100 Å, respectively. The intergate dielectric layer 136 can comprise a material having a high dielectric constant, for example, an oxide-nitride-oxide (ONO) layer.

One select gate 140 is provided on the active region 120 between the first and second memory gates 130a and 130b, with a second gate insulating layer 142 interposed between the one select gate and the active region. The select gate 140 constitutes a select transistor ST. The second gate insulating layer 142 may be a silicon oxide layer that is thicker than the first gate insulating layer 132. The select gate and control gate electrode may be formed of the same material.

A pair of floating diffusion regions 126 and 128 is provided in an active region between the select gate 140 and the first and second memory gates 130a and 130b. The floating diffusion regions 126 and 128 may extend underneath the floating gate electrodes 134. The floating diffusion regions 126 and 128 may have opposite conductivity to that of the semiconductor substrate.

The first memory transistor MT1 and the second memory transistor MT2 correspond to the first and second memory gates 130a and 130b, respectively.

The nonvolatile memory device according to the present invention may further include first and second word lines WL1 and WL2, a select line SL, and first and second bit lines BL1 and BL2.

The first and second word lines WL1 and WL2 are connected to the control gate electrodes of the memory gates 130a and 130b corresponding to the first and second memory transistors MT1 and MT2 and extend across the active region in a second direction. The select line SL is connected to the select gate 140 of the select transistor ST and extends across the active region in the second direction. The first and second bit lines BL1 and BL2 are connected to the first and second impurity diffusion regions 122 and 124, respectively and extend in the first direction, transverse to the second direction.

The first and second impurity diffusion regions 122 and 124 of the memory cell unit MC may include a first extending part 122t and a second extending part 124t that extend in the second direction that is transverse to the longitudinal direction of extension of the active region 120, respectively. The first extending part 122t and the second extending part 124t may extend in opposite directions, as shown. The first and second bit lines BL1 and BL2 may be connected to the first and second extending parts 122t and 124t through vertical plugs that form bit line contacts 122c and 124c. Accordingly, the bit lines BL1 and BL2 extending across memory cell unit can be readily provided in directions that are parallel to each other.

Program and read operations of the memory transistors may be performed by Fowler-Nordheim (F-N) tunneling.

For the program operation of the first memory transistor MT1, a ground voltage 0V is applied to the semiconductor substrate 110, the select gate 140, the second memory gate 130b, and the first impurity diffusion region 122. The second impurity diffusion region 124 is floated. A program-voltage Vpgm is applied to the first memory gate 130a. Accordingly, electrons undergo F-N tunneling to a floating gate electrode of the first memory transistor MT1, and the first memory transistor MT1 has, for example, a first threshold voltage Vth1. The program voltage Vpgm may be, for example, 15V.

For the erase operation of the first memory transistor MT1, a ground voltage 0V is applied to the semiconductor substrate 110 and the second memory gate 130b. The first and second impurity diffusion regions 122 and 124 are floated. An erase voltage Vers is applied to the first memory gate 130a, and a negative operation voltage —Vcc is applied to the select gate 140. Accordingly, electrons stored in the floating gate electrode of the first memory transistor MT1 are released to the semiconductor substrate, so that the first memory transistor MT1 has, for example, a second threshold voltage Vth2. The erase voltage Vers may be, for example, −15V, and the operation voltage may be, for example, 2V.

For the read operation of the first memory transistor MT1, a ground voltage 0V is applied to the semiconductor substrate 110 and the second impurity diffusion region 124. A read voltage Vread is applied to the first impurity diffusion region 122, and an operation voltage Vcc is applied to the first memory gate 130a and the select gate 140, and a pass voltage is applied to the second memory gate 130b. The read voltage Vread may be, for example, 0.5V, and the operation voltage may be, for example, 2V. The pass voltage is smaller than the program voltage Vpgm and greater than the first threshold voltage Vth1, and may be, for example, 5V.

The first memory transistor MT1 and the second memory transistor MT2 have symmetrical structures. Thus, for the operation of the second memory transistor MT2, operation voltages of the first memory transistor MT1 may be symmetrically applied with respect to the first and second memory transistors MT1 and MT2.

Figure 3:
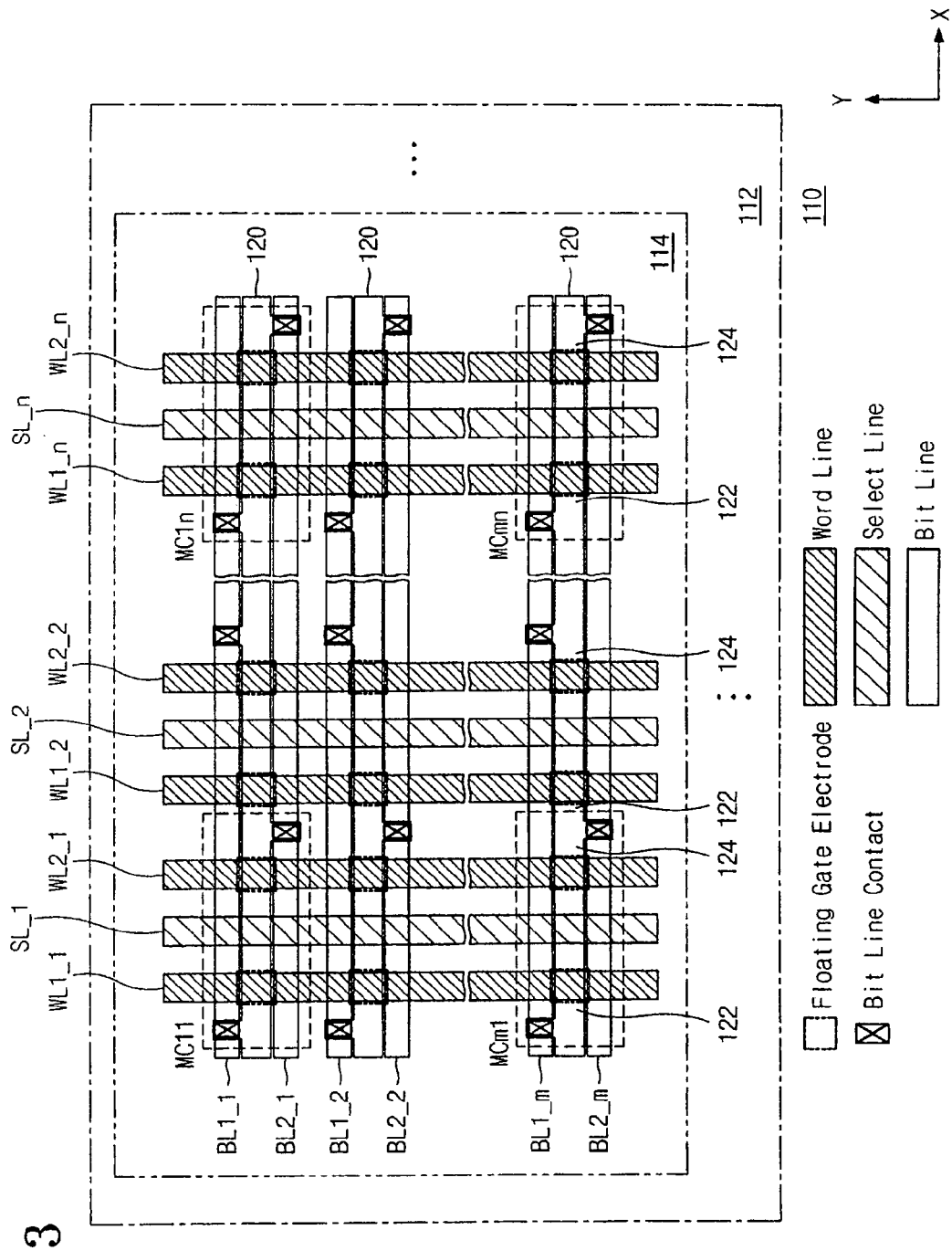
FIG. 3 is an exemplary memory cell array of a nonvolatile memory device according to an embodiment of the present invention.

FIG. 3 is view illustrating an exemplary memory cell array of a nonvolatile memory device according to the present invention, and FIG. 4 is an equivalent circuit of the memory cell array illustrated in FIG. 3.

Referring to FIGS. 3 and 4, the semiconductor device 110 may be a substrate of a first conductivity type, for example, p-type conductivity. The semiconductor substrate 110 may have therein a deep well 112 of a second conductivity type opposite to the first conductivity type, for example, n-type conductivity. A plurality of pocket wells 114 of the first conductivity type may be further provided in the well 112 of the second conductivity type.

The pocket well 114 includes a plurality of memory cell units MC11~MCm1, MC12~MCm2, . . . MC1n~MCmn arranged in a matrix configuration in a row-direction (i.e., the x-direction, or the direction of the bit line) and in a column-direction (i.e., the y-direction, or the direction of the word line). A plurality of first word lines WL1_WL1_n and second word lines WL2_1~WL2_n (control gate electrode) extend in the column-direction across active regions 120 extending in the row-direction. The control gate electrodes arranged in the same column are electrically connected to the same word line. The first and second word lines WL1_1~WL1_n, WL2_1~WL2_n are connected to the control gate electrode of the first memory transistor MT1, and the control gate electrode of the second memory transistor MT2, respectively. Floating gate electrodes are provided in regions where the active regions 120 and the word lines intersect each other.

A plurality of first bit lines BL1_1~BL1_m and second bit lines BL2_1~BL2_m extend in the row-direction along both sides of the active regions 120, crossing the word lines. The bit lines are connected in common to first and second impurity diffusion regions 122 and 124 of adjacent memory cell units MC. For example, the first bit lines BL1_1~BL1_n are connected in common to the first impurity diffusion regions 122 of the odd memory cell units MC11~MCm1, MC13~MCm3 . . . in the row-direction, and to the second diffusion regions 124 of the even memory cell units MC12~MCm2, MC14~MCm4 . . . in the row-direction. The second bit lines BL2_~BL2_n are connected in common to the second impurity diffusion regions 124 of the odd memory cell unit MC11~MCm1, MC13~MCm3 . . . in the row direction, and to the first impurity regions 122 of the even memory cell units MC12~MCm2, MC14~MCm4 . . . in the row direction.

A plurality of select lines SL_1~SL_n between the first and second word lines extend parallel to the word lines. For example, the select line SL_1 is provided between the first word line WL1_1 and the second word line WL2_1. The select line is connected to a select gate 140 of each select transistor ST in the column, as shown in FIGS. 2A and 2B.

In the n-type deep well 112 including the pocket well 114, PMOS transistors may be provided to drive individual word lines.

A method of operation of a non-volatile memory device of the type described above will now be provided.

Figure 5A:
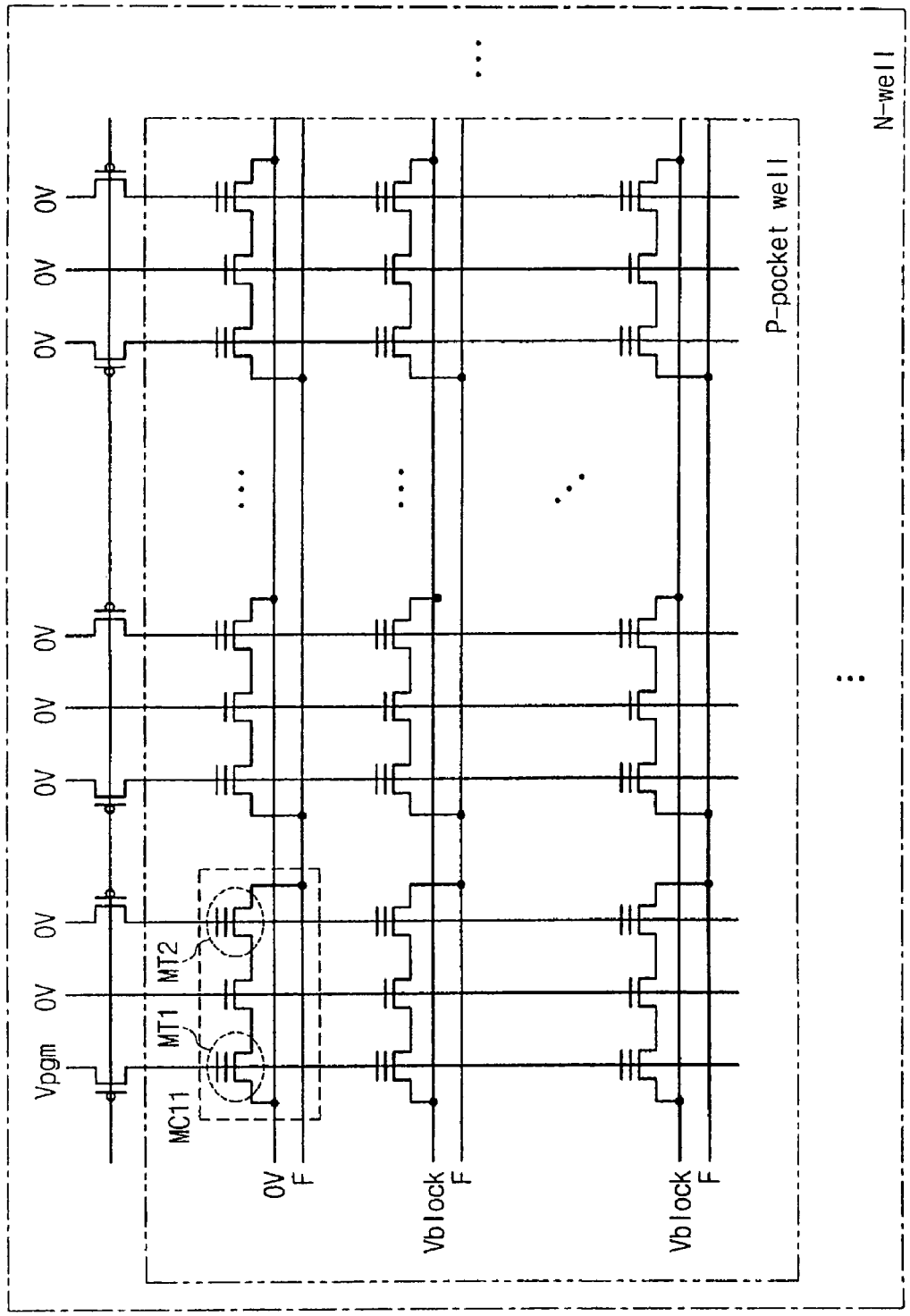
FIGS. 5A to 5C are views illustrating voltage conditions for program, read, and erase operations on the nonvolatile memory device according to embodiments of the present invention.
Figure 5B:
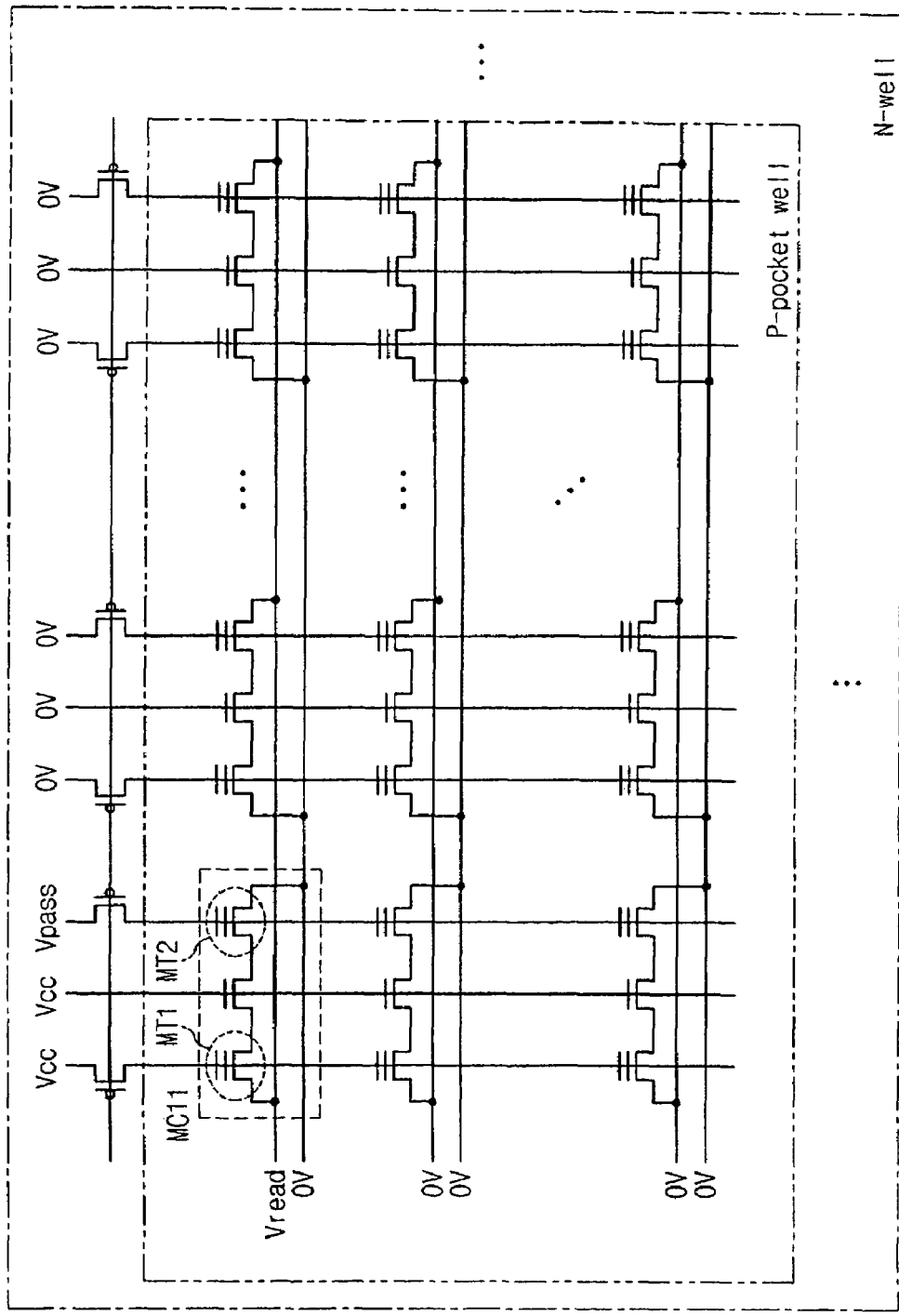
Figure 5C:
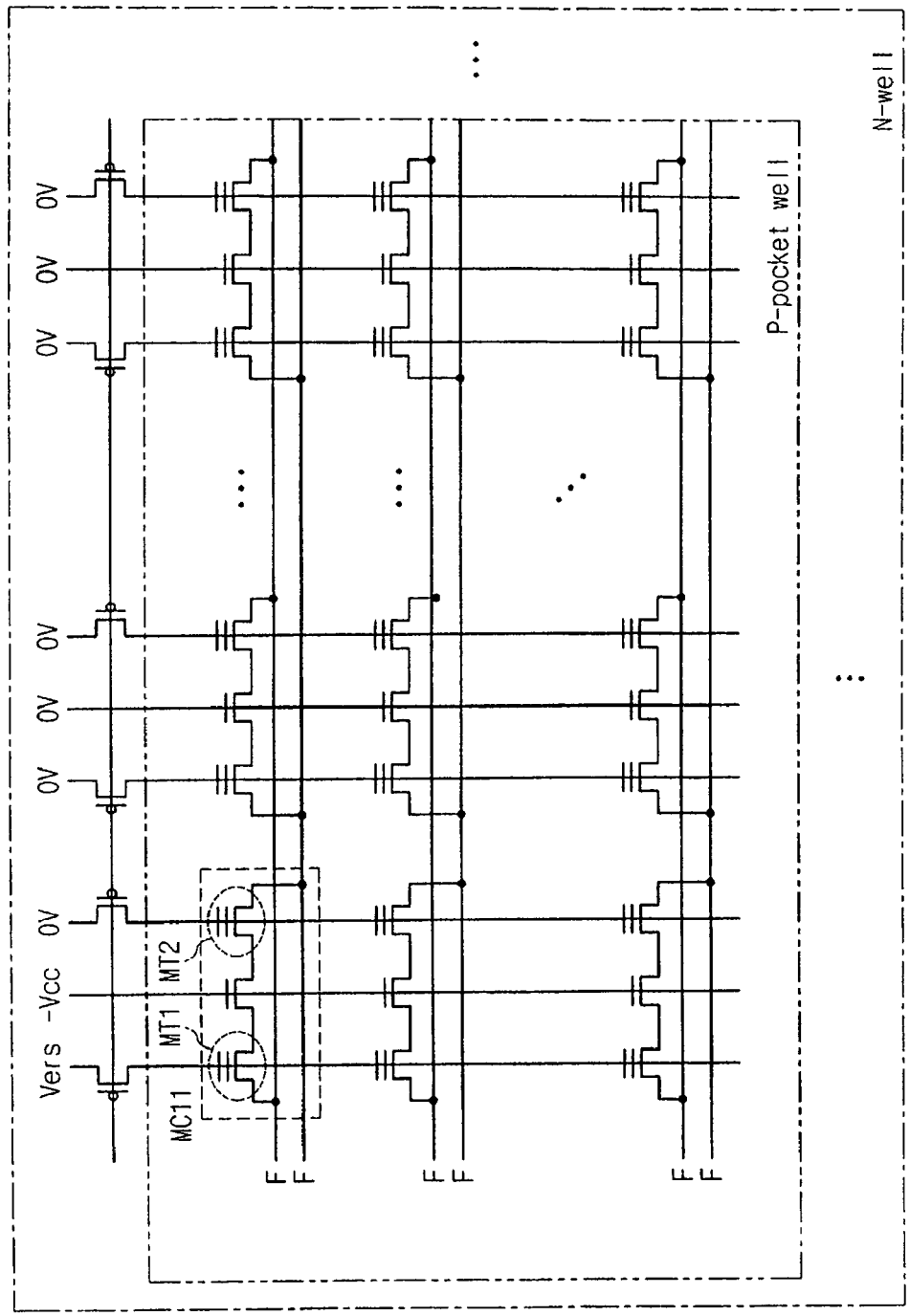

As an example, program, read and erase operations of a first memory transistor MT1 of a first memory cell unit MC11 in the first row and first column will now be described. FIGS. 5A to 5C are views that illustrate voltage conditions for the program, read and erase operations of the nonvolatile memory device according to embodiments of the present invention, respectively.

The following Table 1 exemplarily shows operational conditions according to the disposition of the memory cell unit. Here, 1<k≦m, and 1<l≦n. A ground voltage 0V is applied in common to the pocket well.

TABLE 1

|  | Drive line | Program (V) | Read (V) | Erase (V) |
| --- | --- | --- | --- | --- |
| Selected memory cell unit (MC11) | WL1_1 | Vpgm | Vcc | Vers |
|  | SL_1 | 0 | Vcc | −Vcc |
|  | WL2_1 | 0 | Vpass | 0 |

TABLE 1-continued

|  | Drive line | Program (V) | Read (V) | Erase (V) |
| --- | --- | --- | --- | --- |
| Unselected memory cell unit (MCkl) | BL1_1 | 0 | Vread | F |
|  | BL2_1 | F | 0 | F |
|  | WL1-l | 0 | 0 | 0 |
|  | SL_l | 0 | 0 | 0 |
|  | WL2_l | 0 | 0 | 0 |
|  | BL1_k | Vblock | 0 | F |
|  | BL2_k | F | 0 | F |

Referring to FIG. 5A, conditions for the program operation of the first memory transistor MT1 will now be described.

To perform the program operation on a selected memory cell unit MC11, a program voltage Vpgm is applied to a first word line WL1_1 of the selected memory cell unit MC11. A second bit line BL2_1 of the selected memory cell unit is floated F. A ground voltage 0V is applied to a select line SL1, a second word line WL2_1 and a first bit line BL1_ of the selected memory cell unit. At the same time, in unselected memory cell units MCkl, a ground voltage 0V is applied to word lines WL1_l, WL2_l and select lines SL_l of the unselected memory cell units, a program-block voltage Vblock is applied to first bit lines BL1_k of the unselected memory cell units, and second bit lines BL2_k of the unselected memory cell units are floated. Accordingly, electrons F-N tunnel to a floating gate electrode of the first memory transistor of the selected memory cell unit, so that the first memory transistor MT1 has a first threshold voltage Vth1. The program voltage Vpgm may be, for example, 15V. The program-block voltage Vblock is for preventing malfunctioning caused by electrons tunneling to the unselected memory transistor connected to the same word line, and may be, for example, 7V.

Referring to FIG. 5B, conditions for the read operation of the first memory transistor MT1 will now be described.

In a selected memory cell unit MC11, a read voltage Vread is applied to a first bit line BL1_1 of the selected memory unit, a pass voltage Vpass is applied to a second word line WL2_1 of the selected memory cell unit, an operation voltage Vcc is applied to a first word line WL1_1 and a select line SL_1 of the selected memory cell unit, and a ground voltage 0V is applied to a second bit line BL2_1 of the selected memory cell unit. At the same time, in unselected memory cell units MCkl, a ground voltage 0V is applied to word lines WL1_l, WL2_l, select lines SL_l and bit lines BL1_k, BL2_k of the unselected memory cell unit. The read voltage Vread and the operation voltage Vcc may be 0.5V and 2V, respectively. The pass voltage Vpass is smaller than the program voltage and greater than the first threshold voltage Vth1, and may be, for example, 5V.

Referring to FIG. 5C, conditions for the erase operation of the first memory transistor MT1 will now be described.

In a selected memory cell unit MC11, an erase voltage Vers is applied to a first word line WL1_1 of the selected memory cell unit, a negative operation voltage −Vcc is applied to a select line SL_1 of the selected memory cell unit, a ground voltage 0V is applied to the second word line WL2_1 of the selected memory cell unit. First and second bit lines BL1_1, BL2_1 of the selected memory cell unit are floated F. In unselected memory cell units, a ground voltage 0V is applied to word lines WL1_1, WL2_1 of the unselected memory cell units. Bit lines BL1_k, BL2_k of the unselected memory cell unit are floated F.

Accordingly, electrons stored in a floating gate electrode of memory transistors connected to the first word line WL1_1 of the selected memory cell unit are released to the pocket well, so that the first memory transistor MT1 has a second threshold voltage Vth2 smaller than the first threshold voltage. Memory transistors connected to the first word line WL1_1 of the selected memory cell unit are erased collectively. The erase voltage Vers and the operation voltage Vcc may be −15V and 2V, respectively.

Because the memory transistors of the same memory cell unit MC have symmetrical structures, voltages under the similar conditions to those described above may be applied for operations of the other memory transistor of the pair sharing a common select transistor, for example the second memory transistor MT2 of the memory cell MC.

In an EEPROM according to the present invention, a memory cell unit includes one select gate and two memory gates, thereby allowing a two-bit operation and contributing to high-integration of a device.

While the invention has been particularly shown and described with references to preferred embodiments thereof, it will be understood by those skilled in the art that various changes in form and details may be made herein without departing from the spirit and scope of the invention as defined by the appended claims.

What is claimed is:

1. A nonvolatile memory device having a plurality of memory cell units, the memory cell unit comprising:
   a first impurity diffusion region and a second impurity diffusion region in an active region of a semiconductor substrate;
   first and second memory gates on the active region between the first impurity diffusion region and the second impurity diffusion region, the first and second memory gates each respectively adjacent to the first and second impurity diffusion regions;
   one select gate on the active region between the first and second memory gates; and
   first and second floating diffusion regions in the active region between the select gate and a corresponding one of the first and second memory gates,
   wherein the first memory gate, the second memory gate, and the select gate correspond to a first memory transistor, a second memory transistor, and a select transistor, respectively.

2. The nonvolatile memory device of claim 1, wherein the memory gates include a floating gate electrode, an intergate dielectric layer, and a control gate electrode.

3. The nonvolatile memory device of claim 1, wherein a program operation of the memory transistors is performed by F-N (Flowler-Nordheim) tunneling.

4. The nonvolatile memory device of claim 3, wherein the program operation of the first memory transistor is performed by applying a ground voltage (0V) to the semiconductor substrate, the select gate, the second memory gate and the first impurity diffusion region, floating the second impurity diffusion region, and applying a program voltage (Vpgm) to the first memory gate.

5. The nonvolatile memory device of claim 1, wherein a read operation of the first memory transistor is performed by applying a ground voltage (0V) to the semiconductor substrate and the second impurity diffusion region, applying a read voltage (Vread) to the first impurity diffusion region, applying an operation voltage (Vcc) to the first memory gate and the select gate, and applying a pass voltage (Vpass) to the second memory gate.

6. The nonvolatile memory device of claim 1, wherein an erase operation of the first memory transistor is performed by applying a ground voltage (0V) to the semiconductor substrate and the second memory gate, floating the first and second impurity diffusion regions, applying an erase voltage (Vpgm) to the first memory gate, and applying a negative operation voltage (−Vcc) to the select gate.

7. The nonvolatile memory device of claim 1, further comprising:
   first and second word lines connected to the first and second memory gates, respectively;
   a select line connected to the select gate; and
   first and second bit lines connected to the first and second impurity diffusion regions, respectively.

8. The nonvolatile memory device of claim 7, wherein the first and second impurity diffusion regions include first and second extending parts extending in a direction transverse to a longitudinal direction of extension of the active region, respectively, the first extending part and the second extending part extending in opposite directions relative to the longitudinal direction of extension of the active region.

9. The nonvolatile memory device of claim 8, wherein the first and second bit lines are connected to the first and second extending parts, respectively.

10. The nonvolatile memory device of claim 7, wherein the memory cell units are arranged on the semiconductor substrate in a matrix configuration in a row-direction and a column-direction, and the bit lines are connected in common to the first and second impurity diffusion regions of adjacent memory cell units.

11. The nonvolatile memory device of claim 10, wherein the word line and the select line extend in the column-direction, and the bit line extends in the row-direction.

12. The nonvolatile memory device of claim 11, wherein the first impurity diffusion regions of odd memory cell units in the row-direction, and the second impurity diffusion regions of even memory cell units in the row-direction are connected to the first bit line, and
   the second impurity diffusion regions of the odd memory cell units in the row-direction, and the first impurity diffusion regions of the even memory cell units in the row-direction are connected to the second bit line.

13. The nonvolatile memory device of claim 12, wherein a program operation of a first memory transistor of a selected memory cell unit comprises:
   applying a program voltage (Vpgm) to the first word line of the selected memory cell unit;
   applying a ground voltage (0V) to the semiconductor substrate, the select line, the second word line, and the first bit line of the selected memory cell unit; and
   floating the second bit line of the selected memory cell unit.

14. The nonvolatile memory device of claim 13, the program operation further comprising applying a program-block voltage (Vblock) to the first bit lines of unselected memory cell units, floating the second bit lines of the unselected memory cell units, and applying a ground voltage (0V) to the word lines and the select lines of the unselected memory cell units.

15. The nonvolatile memory device of claim 12, wherein a read operation of the first memory transistor of the selected memory cell unit of the memory cell units comprises:
   applying a read voltage (Vread) to the first bit line of the selected memory cell unit;
   applying an operation voltage (Vcc) to the first word line and the select line of the selected memory cell unit;
   applying a pass voltage (Vpass) to the second word line of the selected memory cell unit; and
   applying a ground voltage to the semiconductor substrate and the second bit line of the selected memory cell unit.

16. The nonvolatile memory device of claim 15, the read operation further comprising applying a ground voltage (0V) to the word lines, the select lines, and the bit lines of the unselected memory cell units.

17. The nonvolatile memory device of claim 12, wherein an erase operation of the first memory transistor of the selected memory cell unit of the memory cell units comprises:

applying an erase voltage (Vers) to the first word line of the selected memory cell unit;

applying a negative operation voltage (−Vcc) to the select line of the selected memory cell unit;

floating the first and second bit lines of the selected memory cell unit; and applying a ground voltage (0V) to the semiconductor substrate and the second word line of the selected memory cell unit.

18. The nonvolatile memory device of claim 17, the erase operation further comprising floating the bit lines of the unselected memory cell units and applying a ground voltage (0V) to the word lines and the select lines of the unselected memory cell units.

19. A nonvolatile memory device having a plurality of memory cell units, the memory cell unit comprising:

first and second memory transistors in an active region in a semiconductor substrate;

one select transistor in the active region between the first and second memory transistors; and first and second bit lines connected to the first and second memory transistors, respectively, wherein the first memory transistor, the select transistor and the second memory transistor are connected in series between the first and second bit lines.

* * * * *